(12) United States Patent
Wu

(10) Patent No.: US 6,500,712 B1
(45) Date of Patent: Dec. 31, 2002

(54) FABRICATION OF DIELECTRIC IN TRENCHES FORMED IN A SEMICONDUCTOR SUBSTRATE FOR A NONVOLATILE MEMORY

(75) Inventor: Kuo-Chun Wu, San Jose, CA (US)

(73) Assignee: Mosel Vitelic, Inc. (TW)

( * ) Notice: Subject to any disclaimer, the term of this patent is extended or adjusted under 35 U.S.C. 154(b) by 0 days.

(21) Appl. No.: 10/174,442

(22) Filed: Jun. 17, 2002

(51) Int. Cl.[7] .............................................. H01L 21/336
(52) U.S. Cl. ........................ 438/257; 438/266; 438/424; 438/427
(58) Field of Search ................................. 438/257, 259, 438/263, 264, 266, 258, 261, 262, 424, 427, 426, 428, 430, 437

(56) References Cited

U.S. PATENT DOCUMENTS

| | | | |
|---|---|---|---|
| 6,013,551 A | 1/2000 | Chen et al. | 438/264 |
| 6,261,157 B1 | 7/2001 | Bajaj et al. | 451/57 |
| 6,326,263 B1 * | 12/2001 | Hsieh | 438/257 |
| 6,355,524 B1 | 3/2002 | Taun et al. | 438/257 |

OTHER PUBLICATIONS

S. Aritome et al., "A 0.67um$^2$ Self–Aligned Shallow Trench Isolation Cell (SA–STI Cell) for 3V–only 256Mbit NAND EEPROMs", IEDM Technical Digest, 1994, pp. 61–64.
K. Shimizu et al., "A Novel High–Density 5F$^2$ NAND STI Cell Technology Suitable for 256Mbit and 1Gbit Flash Memories", IEDM Technical Digest, 1997, pp. 271–274.
Riichiro Shirota, "A Review of 256Mbit NAND Flash Memories and NAND Flash Future Trend", pp. 22–31.

* cited by examiner

Primary Examiner—Tuan H. Nguyen
Assistant Examiner—Jack Chen
(74) Attorney, Agent, or Firm—Skjerven Morrill LLP; Michael Shenker

(57) ABSTRACT

To form substrate isolation for a nonvolatile memory, floating gate polysilicon (410) is formed over a semiconductor substrate (110), then silicon nitride (130) is deposited, and then the nitride, the floating gate polysilicon and the substrate are etched to form isolation trenches (140). Dielectric (150) is formed in the trenches and over the silicon nitride. The dielectric thickness is relatively small so that the top surface (150T) of the dielectric over the trenches lies at all times below the top surface of silicon nitride. The dielectric deposition and polishing times are therefore reduced. Other embodiments are also provided.

10 Claims, 5 Drawing Sheets

FABRICATION OF DIELECTRIC IN TRENCHES FORMED IN A SEMICONDUCTOR SUBSTRATE FOR A NONVOLATILE MEMORY

BACKGROUND OF THE INVENTION

The present invention relates to fabrication of integrated circuits, and more particularly to fabrication of dielectric in trenches formed in a semiconductor substrate for a nonvolatile memory.

Dielectric-filled trenches in a semiconductor substrate have been used to provide isolation between active areas of an integrated circuit. The active areas contain circuit elements such as transistor regions, interconnect lines, etc. FIG. 1 illustrates fabrication of the dielectric-filled trenches in a monocrystalline silicon substrate 110. Silicon dioxide layer 120 ("pad oxide") is grown on substrate 110. Silicon nitride 130 is deposited on oxide 120. A photoresist mask (not shown) is photolithographically formed on nitride 130 to define trenches 140. Nitride 130, oxide 120 and substrate 110 are etched through the mask openings. Trenches 140 are formed in substrate 110 as a result.

A thick silicon dioxide layer 150 is formed over the structure. Oxide 150 fills the trenches 140 and covers the nitride 130. Oxide 150 is polished using a chemical mechanical polishing process (CMP) that stops on nitride 130. The resulting structure is shown in FIG. 2. Then nitride 130 and oxide 120 are removed (FIG. 3). The thickness of trench oxide 150 may be reduced by an etch at this stage if desired.

FIGS. 4–5 illustrate a modified trench fabrication process for a flash memory. Silicon dioxide 120 is formed on substrate 110. Oxide 120 will be used as a tunnel oxide for the flash memory cells. Conductive polysilicon 410 is deposited on oxide 120. Polysilicon 410 will be used to fabricate floating gates for the memory cells. Then silicon nitride 130 is deposited. A photoresist mask (not shown) is photolithographically formed on nitride 130 to define isolation trenches 140. Nitride 130, polysilicon 410, oxide 120, and substrate 110 are etched through the mask openings. Trenches 140 are formed as a result. Polysilicon 410 is thus self-aligned to the trenches. Then silicon dioxide 150 is deposited as in FIG. 1, and polished by a CMP process that stops on nitride 130. See FIG. 5, and see K. Shimizu et al., "A Novel High-Density $5F^2$ NAND STI Cell Technology Suitable for 256 Mbit and 1 Gbit Flash Memories", IEDM Technical Digest, 1997, pages 271–274. Silicon nitride 130 is later removed.

It is desirable to reduce the thickness to which the oxide 150 is deposited because the reduced oxide thickness will result in reduced oxide deposition and polishing times.

SUMMARY

The invention is defined by the appended claims which are incorporated into this section by reference. Summarized below are some features of the invention.

In the structure of FIG. 3, the top surface 150T of oxide 150 must not be allowed to fall below the top surface of silicon substrate 110. If the top surface 150T of oxide 150 falls below the top surface of substrate 110, then some conductive material formed later during fabrication could be caught up in the trench above the oxide 150, and could reduce the resistance of the parasitic transistor in the trench area. To ensure that the top surface of oxide 150 does not fall below the top surface of substrate 110, oxide 150 is deposited to a large thickness. At the stage of FIG. 1, the top surface of oxide 150 lies above the top surface of nitride 130 in the trench areas.

The same holds true for FIG. 4.

The inventor has observed that due to the presence of polysilicon 410 in the structure of FIG. 4, there is a wider margin of error with respect to the thickness of oxide 150 when oxide 150 is deposited. The top surface 150T of oxide 150 can be located below the top surface of nitride 130, as shown in FIG. 6, because the top surface of nitride 130 is positioned higher above substrate 110 due to the presence of polysilicon 410.

Other embodiments and variations are described below. The invention is defined by the appended claims.

DESCRIPTION OF SOME EMBODIMENTS

The examples in this section are provided for illustration and not to limit the invention. The invention is not limited to particular circuits, materials, processes, process parameters, equipment, or dimensions.

Figure 1:
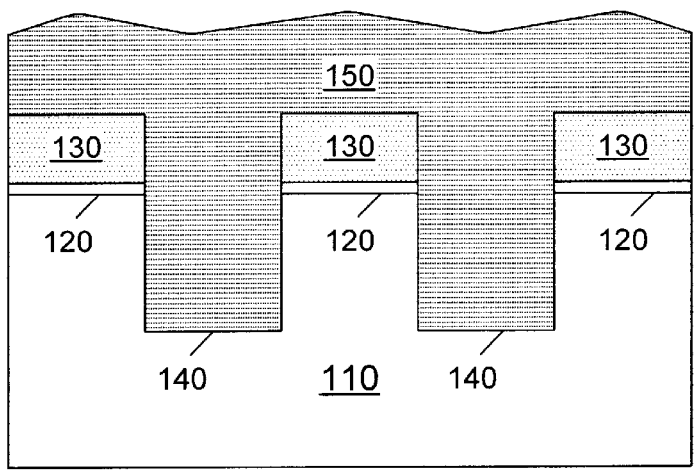
FIGS. 1–5 are cross section illustrations of integrated circuits during fabrication in prior art fabrication processes.
Figure 2:
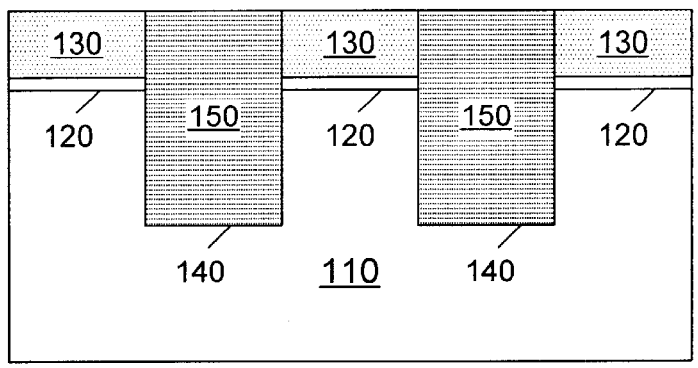
Figure 3:
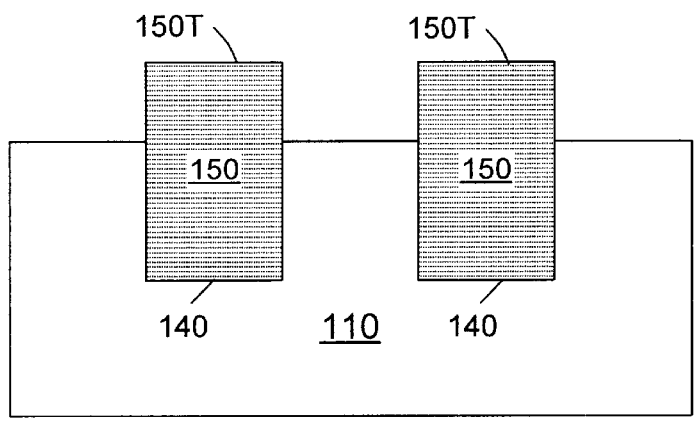
Figure 4:
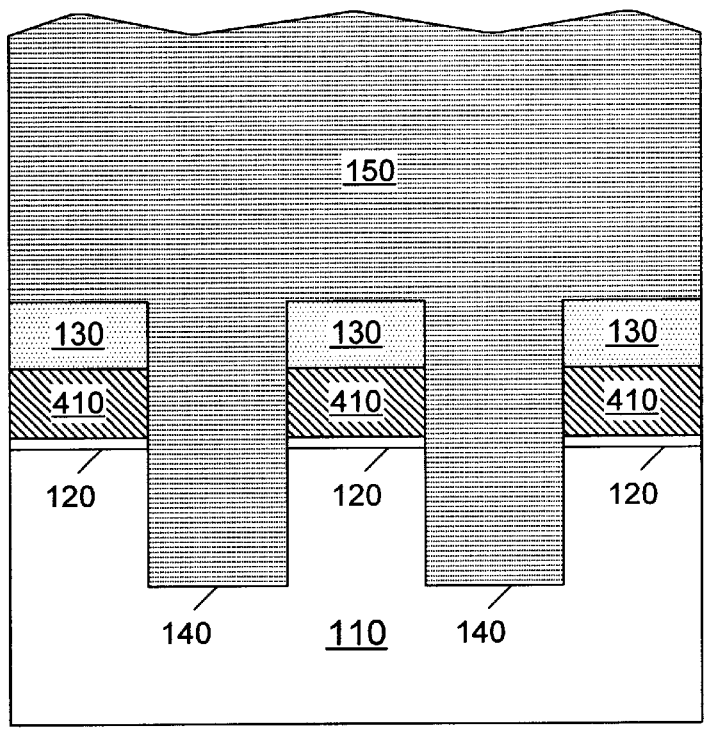
Figure 5:
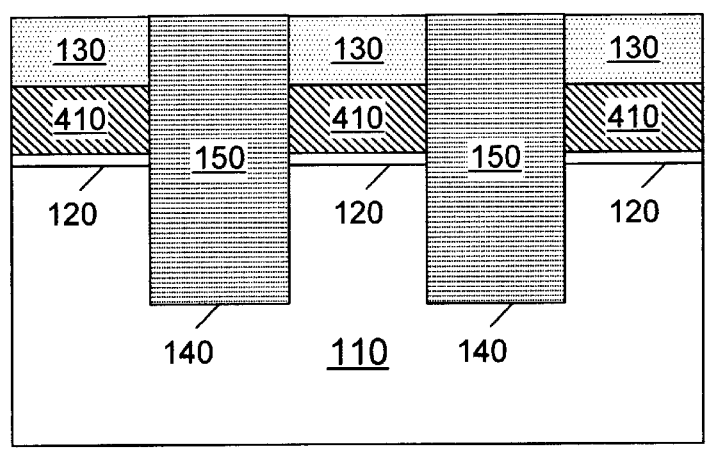
Figure 6:
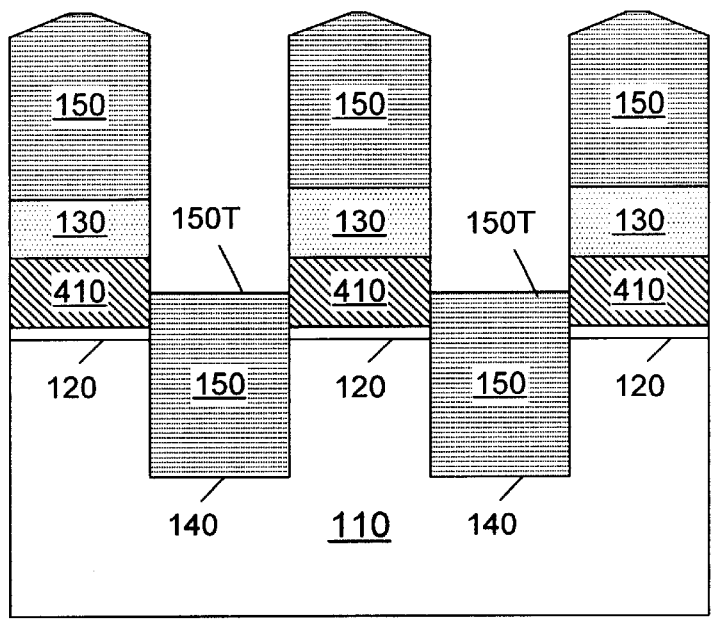
FIGS. 6–12 are cross section illustrations of integrated circuits during fabrications according to some embodiments of the present invention.

FIG. 6 illustrates one embodiment of the present invention. Substrate 110 may be processed to form suitable wells (not shown) as described, for example, in U.S. patent application Ser. No. 09/640,139 filed Aug. 15, 2000 by H. T. Tuan et al. and incorporated herein by reference. Then the structure is processed as in FIG. 4 to form isolation trenches 140. Exemplary dimensions and processing techniques are described in the U.S. patent application Ser. No. 09/640,139. The dimensions can be as follows:

TABLE 1

| | |
|---|---|
| Tunnel oxide 120 | 9 nm |
| Polysilicon 410 | 120–180 nm |
| Silicon nitride 130 | 40–120 nm (90 nm in some cases) |
| Depth of trenches 140 | 200–270 nm |
| Width of each trench 140 | 140–180 nm |
| Length of each trench 140 | 1.38 µm to a few millimeters |

Other dimensions and processing techniques can also be used.

Trench oxide layer 150 can be a combination of different oxide layers including, for example, a thick layer of silicon dioxide deposited by high density plasma chemical vapor deposition (HDP-CVD). Exemplary deposition techniques are described in U.S. patent application Ser. No. 10/033,114 filed Oct. 22, 2001 by Tai-Peng Lee et al. and incorporated herein by reference. In one embodiment, the deposition is performed in a tool of type SPEED™ available from NOVELLUS, Inc. of San Jose, Calif. Exemplary deposition parameters are:

| | |
|---|---|
| SiH₄ flow rate | 130 sccm (standard cubic centimeters per minute) |
| Oxygen flow rate | 170 sccm |
| Helium flow rate | 325 sccm |
| Pressure | 6.3 mTorr |
| RF power to generate high density plasma | 2000 W |

Other parameters and deposition equipment and processes are also suitable.

The top surface 150T of oxide 150 is above the substrate 110 throughout. Over the trenches, some or all of the top surface 150T lies below the top surface of nitride 130. In FIG. 6, the top oxide surface 150T over trenches 140 lies below the top surface of polysilicon 410, though this is not necessary.

Figure 7:
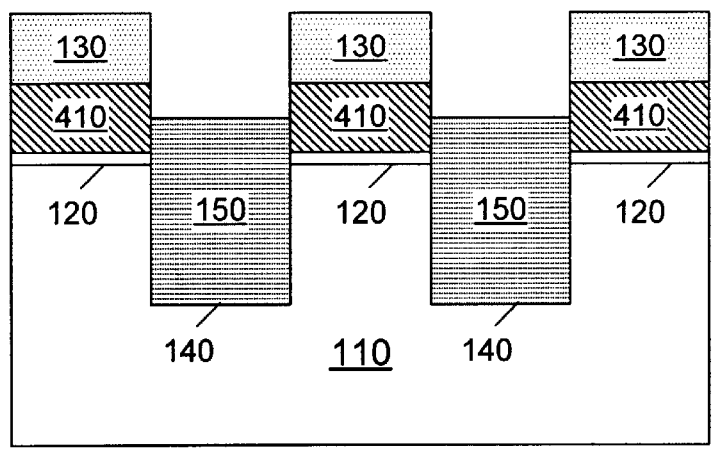

Then oxide 150 is polished by CMP. Nitride 130 acts as a polishing stop. See FIG. 7. The polishing can be performed with a slurryless CMP to avoid a slurry being caught up above the trenches between the features formed by nitride 130 and polysilicon 410. Since no slurry is caught up in these openings, the polishing of oxide 150 over the trenches is minimized, and the oxide scratching is reduced. Fixed-abrasive polishing pads can be used. In one fixed-abrasive pad embodiment, the polishing is performed in a web Reflexion CMP system available from Applied Materials of Santa Clara, Calif. The polishing pad is of type SWR-159, and the sub-pad is of type 6900, both available from 3M of St. Paul, Minn. The downward pressure is 3 psi. The platen speed is 43 rpm. The carrier speed is 37 rpm. A polishing solution consisting of a mixture of ionized water and KOH, having pH=11.5, is supplied on the platen at 400 ml/min. Other equipment, techniques and process parameters, including processes with slurries and non-fixed-abrasive polishing pads, can also be used.

Figure 8:
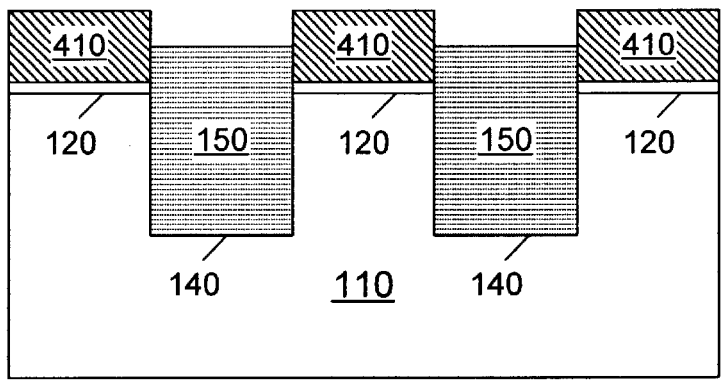
Figure 9:
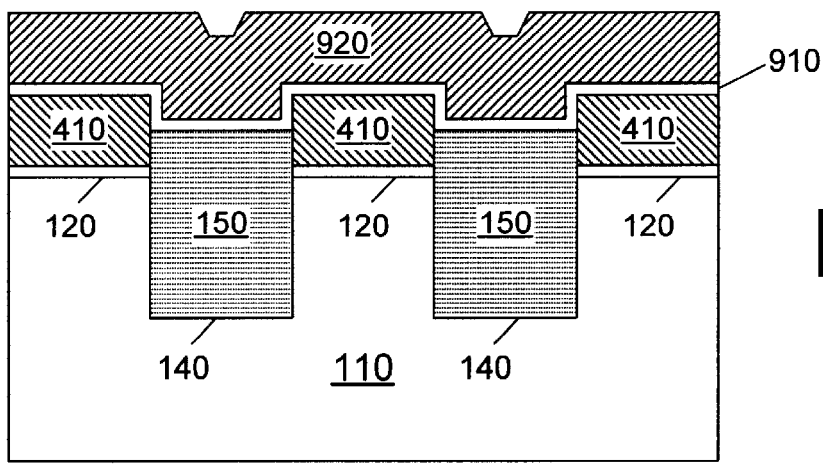

The integrated circuit fabrication can be completed using conventional techniques. In the example of FIG. 8, nitride 130 is removed. Then a dielectric 910 (FIG. 9) is formed on polysilicon 410. Dielectric 910 can be ONO (a sandwich of silicon nitride, silicon dioxide, and silicon nitride layers). Conductive layer 920, e.g. doped polysilicon, is deposited to form control gates for the flash memory cells. In the example shown, the top surface of oxide 150 is advantageously positioned below the top surface of polysilicon 410. Control gates 920 come down along the sidewalls of polysilicon 410 in the trench areas, increasing the capacitive coupling between the floating and control gates. See S. Aritome et al., "A 0.67 um² SELF-ALIGNED SHALLOW TRENCH ISOLATION CELL (SA-STI CELL) FOR 3V-only 256 Mbit NAND EEPROMs", IEDM Technical Digest, 1994, pages 61–64, incorporated herein by reference.

If desired, a timed etch of oxide 150 can be performed before the formation of dielectric 910 to recess the oxide more relative to the sidewalls of polysilicon 410.

Figure 10:
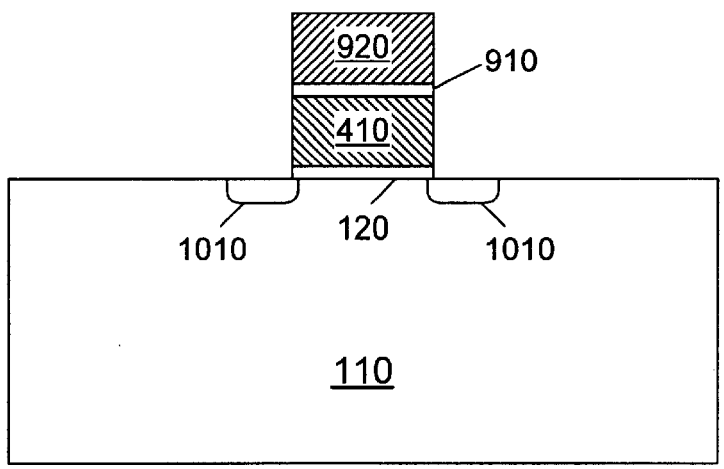

The layers 920, 910, 410 can be patterned, possibly using a single photolithographic mask. As a result, some of polysilicon 410 can be removed from the active areas. See FIG. 10 showing a cross section by a plane perpendicular to the cross sectional plane of FIG. 9 and passing between the trenches 140. The active areas can be doped to form source/drain regions 1010 for the memory cells. See also the aforementioned U.S. patent application Ser. No. 09/640,139.

Figure 11:
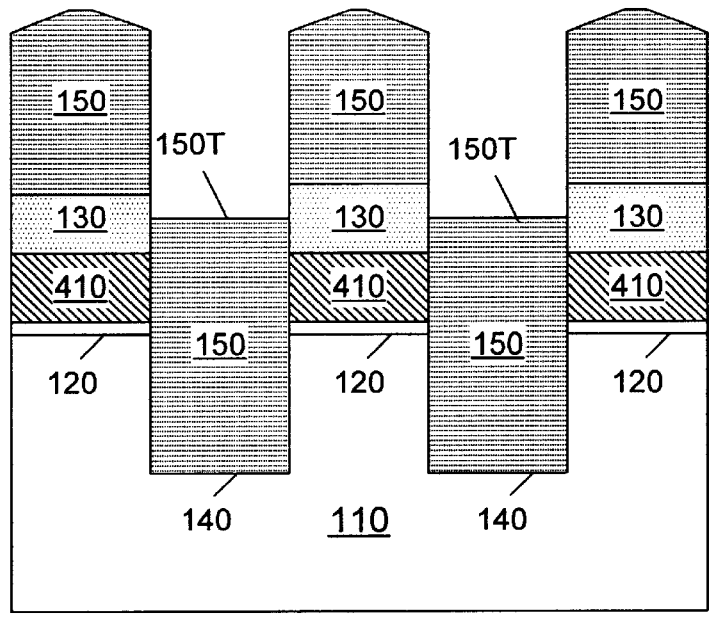

In the embodiment of FIG. 11, the top surface of oxide 150 immediately after deposition is above the polysilicon 410. Oxide 150 can be etched down after the CMP to achieve the structure of FIG. 8 if desired.

Figure 12:
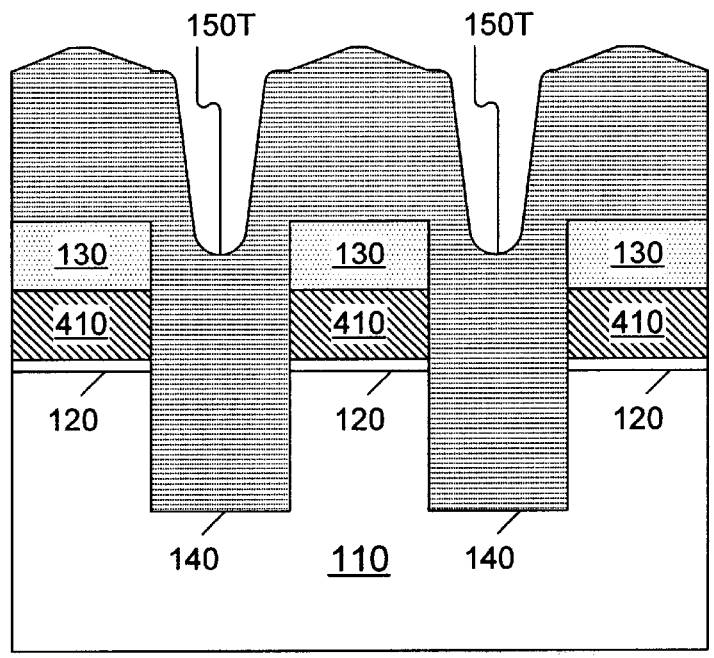

In FIGS. 6 and 11, oxide 150 is shown not to be formed on the sidewalls of nitride 130 during deposition. In fact, some of oxide 150 may form on the nitride sidewalls, as explicitly shown in FIG. 12. A portion, but not all, of the oxide top surface 150T over the trenches lies below the top surface of nitride 130.

The invention is not limited to the particular processes, dimensions, and materials described above. Silicon dioxide can be replaced with other dielectric materials. Silicon nitride 130 can also be replaced with other materials. The invention is applicable to non-silicon integrated circuits. The invention is applicable to many different memory types, including stacked gate memories described in the aforementioned U.S. patent application Ser. No. 09/640,139, or memories described in the articles by Shimizu et al. and Aritome et al. cited above, or other nonvolatile memories, known or to be invented. The invention is not limited to flash memories, but is applicable to non-flash EEPROMs and possibly other nonvolatile memory types. The invention is defined by the appended claims.

What is claimed is:

1. A method for fabricating a nonvolatile memory, the method comprising:
    forming a conductive layer over a semiconductor substrate to provide a floating gate for a nonvolatile memory cell;
    forming a first layer over the conductive layer to provide a stop layer for a polishing operation;
    forming one or more trenches in the substrate;
    forming a first dielectric so as to cover the first layer and fill the trenches, wherein at all times at least a portion of the top surface of the first dielectric over at least one of the trenches is below the top surface of the first layer;
    performing said polishing operation to remove the first dielectric from the top surface of the conductive layer.

2. The method of claim 1 wherein at the conclusion of the first dielectric forming operation, the top surface of the first dielectric is not lower than the top portion of the semiconductor substrate.

3. The method of claim 1 further comprising removing at least a portion of the first layer after the polishing operation.

4. The method of claim 1 further comprising removing the first layer after the polishing operation.

5. The method of claim 1 further comprising forming a second dielectric over the substrate before forming the conductive layer, wherein the conductive layer is formed on the second dielectric.

6. The method of claim 1 wherein:
    the thickness of the conductive layer is at least 120 nm and at most 180 nm;
    the thickness of the first layer is at least 40 nm and at most 120 nm.

7. The method of claim 6 wherein the depth of the trenches is at least 200 nm and at most 270 nm.

8. The method of claim 6 further comprising forming a second dielectric over the substrate before forming the conductive layer, wherein the thickness of the second dielectric is about 9 nm.

9. The method of claim 8 wherein the depth of the trenches is at least 200 nm and at most 270 nm.

10. The method of claim 1 wherein the substrate contains a source/drain region of the memory cell, and the source/drain region is adjacent to one or more of the trenches.

* * * * *